(12) United States Patent
Chao et al.

(10) Patent No.: US 11,747,742 B2
(45) Date of Patent: Sep. 5, 2023

(54) APPARATUS AND METHOD FOR REMOVING PHOTORESIST LAYER FROM ALIGNMENT MARK

(71) Applicant: VisEra Technologies Company Limited, Hsin-Chu (TW)

(72) Inventors: Yuan-Chun Chao, Hsinchu (TW); Tian-Wen Liao, New Taipei (TW); Wei-Chuan Chen, Changhua County (TW); Yi-Chang Chang, Yunlin County (TW); Yu-Ming Tseng, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 602 days.

(21) Appl. No.: 15/484,734

(22) Filed: Apr. 11, 2017

(65) Prior Publication Data
US 2018/0292758 A1 Oct. 11, 2018

(51) Int. Cl.
*G03F 7/20* (2006.01)
*H01L 23/544* (2006.01)
(Continued)

(52) U.S. Cl.
CPC ........ *G03F 7/70925* (2013.01); *G03F 9/7084* (2013.01); *H01L 21/31133* (2013.01); *H01L 21/6708* (2013.01); *H01L 21/68* (2013.01); *H01L 23/544* (2013.01); *B08B 5/043* (2013.01); *H01L 2223/54426* (2013.01)

(58) Field of Classification Search
None
See application file for complete search history.

(56) References Cited

U.S. PATENT DOCUMENTS 5,803,970 A * 9/1998 Tateyama ................ G03F 7/162
134/53
6,079,428 A * 6/2000 Anai .................... H01L 21/6715
134/144
(Continued)

FOREIGN PATENT DOCUMENTS

JP H-05166720 A 7/1993
JP 09-029158 A 2/1997
(Continued)

OTHER PUBLICATIONS

An Office Action issued in corresponding KR Application No. 10-2017-0081593 dated Aug. 29, 2018.
(Continued)

*Primary Examiner* — Nicole Blan
(74) *Attorney, Agent, or Firm* — Muncy, Geissler, Olds & Lowe, P.C.

(57) ABSTRACT

An apparatus for removing a photoresist layer from at least one alignment mark of a wafer is provided. The apparatus includes a holder, a solvent dispenser, and a suction unit. The holder is used to support the wafer, wherein the alignment mark is formed in a peripheral region of the wafer. The solvent dispenser is used to spray a solvent onto the photoresist layer on the alignment mark of the wafer to generate a dissolved photoresist layer. The suction unit is used to remove the dissolved photoresist layer and the solvent from the wafer through exhausting.

10 Claims, 7 Drawing Sheets

(51) Int. Cl.
*H01L 21/68* (2006.01)
*H01L 21/311* (2006.01)
*G03F 9/00* (2006.01)
*H01L 21/67* (2006.01)
*B08B 5/04* (2006.01)
*G03F 7/00* (2006.01)

(56) References Cited

U.S. PATENT DOCUMENTS

| | | | |
|---|---|---|---|
| 6,261,970 B1* | 7/2001 | Jeon | G03F 7/422 |
| | | | 257/E21.255 |
| 6,453,916 B1 | 9/2002 | Tran et al. | |
| 6,682,605 B2 | 1/2004 | Cheng et al. | |
| 2004/0241594 A1* | 12/2004 | Cheng | G03F 7/0007 |
| | | | 430/328 |
| 2007/0186850 A1* | 8/2007 | Matsuoka | H01L 21/67173 |
| | | | 118/719 |
| 2009/0211603 A1* | 8/2009 | Winter | B08B 3/02 |
| | | | 134/18 |
| 2010/0212701 A1* | 8/2010 | Nanba | H01L 21/67051 |
| | | | 134/95.1 |
| 2011/0265823 A1* | 11/2011 | Ravkin | B08B 3/04 |
| | | | 134/21 |
| 2012/0160279 A1* | 6/2012 | Konishi | H01L 21/67051 |
| | | | 134/99.1 |
| 2013/0174873 A1* | 7/2013 | Yoshihara | H05K 3/26 |
| | | | 134/19 |
| 2014/0051258 A1* | 2/2014 | Izumoto | H01L 21/30604 |
| | | | 438/748 |
| 2014/0360539 A1* | 12/2014 | Liu | H01L 21/67017 |
| | | | 134/198 |
| 2015/0209834 A1* | 7/2015 | Shi | B08B 3/024 |
| | | | 134/34 |

FOREIGN PATENT DOCUMENTS

| | | |
|---|---|---|
| JP | 2001198515 A | 7/2001 |
| JP | 2004200405 A | 7/2004 |
| JP | 2004319625 A | 11/2004 |
| JP | 2005016155 A | 1/2005 |
| JP | 2007243030 A | 9/2007 |
| JP | 2007316360 A | 12/2007 |
| JP | 2008277359 A | 11/2008 |
| JP | 2009042582 A | 2/2009 |
| JP | 2011198933 A | 10/2011 |
| JP | 2015179272 A | 10/2015 |
| KR | 10-2005-0083540 A | 8/2005 |
| KR | 10-2011-0119382 A | 11/2011 |
| TW | 508635 B | 11/2002 |
| TW | 200424806 A | 11/2004 |
| TW | I226975 | 1/2005 |
| TW | 201205207 A | 2/2012 |
| WO | WO2011/115155 A1 | 9/2011 |

OTHER PUBLICATIONS

Notice of Grant Based on Japanese Application No. 2017-146652; dated Jan. 15, 2019.
An Office Action dated Feb. 1, 2021 in CN Application No. 2021012702429820, 8 pages.
Office Action dated Jul. 14, 2020 in CN Application No. 201710562482.3.

* cited by examiner

APPARATUS AND METHOD FOR REMOVING PHOTORESIST LAYER FROM ALIGNMENT MARK

BACKGROUND OF THE INVENTION

Field of the Invention

The present disclosure relates to a semiconductor process technology, and more particularly to an apparatus and a method for removing a photoresist layer from at least one alignment mark of a wafer.

Description of the Related Art

Alignment is critical in photolithography and deposition, as well as in other semiconductor processes. If layers are not deposited properly, or if they are not selectively removed properly, the resulting semiconductor devices may not function, relegating them to scrap, which can be costly. Therefore, alignment marks are placed on a semiconductor wafer to ensure proper positioning during deposition and photolithography processes.

FIG. 1 is a schematic plane view of a conventional wafer 100. As shown in FIG. 1, a plurality of IC dies 102 are uniformly distributed throughout the wafer 100, and at least one alignment mark 104 is formed in the peripheral region of the wafer 100.

It should be noted that alignment is especially critical while a number of metal or other layers have already been deposited on the wafer. In particular, subsequent deposition of silicon dioxide or other layers in such instances usually requires that the alignment marks 104 on the wafer 100 be exposed for proper overlay of the silicon dioxide or other layers, since the photoresist layer used to pattern or perform other processing of these layers can easily cover or at least blur the alignment marks 104, causing the alignment to fail.

A cleaning method of using cotton swabs and acetone to manually remove the photoresist layer from the alignment marks 104 is widely used in the industry. Although the photoresist layer on the alignment marks 104 can be removed, this manual cleaning method inevitably results in die loss in the peripheral region of the wafer 100. For example, as shown in FIG. 1, the IC dies 106 close to the alignment marks 104 will all be lost due to the manual removal of the photoresist layer. Thus, the fabrication yield is adversely affected. In addition, the manual cleaning method is also time-consuming and makes it difficult to control cleanliness and quality.

Therefore, an automatic cleaning method which can improve the above problems of the manual cleaning method is needed.

BRIEF SUMMARY OF THE INVENTION

The present disclosure provides an apparatus and a method for removing a photoresist layer from at least one alignment mark of a wafer. The apparatus and the method can quickly and accurately remove the photoresist layer from at least one alignment mark in the peripheral region of the wafer, so as to reduce die loss and processing time.

An embodiment of an apparatus for removing a photoresist layer from at least one alignment mark of a wafer is provided. The apparatus includes a holder, a solvent dispenser, and a suction unit. The holder is used to support the wafer, wherein the alignment mark is formed in a peripheral region of the wafer. The solvent dispenser is used to spray a solvent onto the photoresist layer on the alignment mark of the wafer to generate a dissolved photoresist layer. The suction unit is used to remove the dissolved photoresist layer and the solvent from the wafer.

In some embodiments, the solvent dispenser is movable toward or away from the wafer.

In some embodiments, the apparatus further includes a motor used to drive the solvent dispenser forward and backward and a cylinder used to drive the solvent dispenser up and down.

In some embodiments, the solvent dispenser includes a movable arm and a nozzle connected to the movable arm. The nozzle is configured to be inclined with respect to the surface of the wafer, and the outlet of the nozzle faces toward the edge of the wafer.

In some embodiments, the apparatus further includes a pipe and a flow meter. The pipe is connected to the solvent dispenser for supplying the solvent. The flow meter is provided to the pipe for measuring the flow rate of the solvent flowing in the pipe.

In some embodiments, the suction unit is movable toward or away from the wafer.

In some embodiments, the solvent dispenser and the suction unit are movable together along a direction that is parallel to the surface of the wafer.

In some embodiments, the apparatus further includes an alignment unit used to determine the position of the alignment mark of the wafer by searching for an orientation notch on the wafer and used to generate a position signal.

In some embodiments, the apparatus further includes a driving mechanism connected to the holder and used to drive the holder and the wafer to rotate according to the position signal from the alignment unit, so that the alignment mark reaches a position where the outlet of the solvent dispenser and the inlet of the suction unit are aligned with and close to the alignment mark.

In some embodiments, the apparatus further includes a drain unit used to collect the solvent falling from the wafer.

An embodiment of a method for removing a photoresist layer from at least one alignment mark of a wafer is provided. The method includes providing a holder. The method further includes positioning the wafer on the holder, wherein the alignment mark is formed in a peripheral region of the wafer, and the photoresist layer is coated on the alignment mark. The method also includes providing a solvent dispenser to spray a solvent onto the photoresist layer on the alignment mark to generate a dissolved photoresist layer. In addition, the method includes providing a suction unit to remove the dissolved photoresist layer and the solvent from the wafer.

In some embodiments, the solvent dispenser is movable toward or away from the wafer.

In some embodiments, the solvent dispenser includes a movable arm and a nozzle connected to the movable arm. The nozzle is configured to be inclined with respect to the surface of the wafer, and the outlet of the nozzle faces toward the edge of the wafer.

In some embodiments, the suction unit is movable toward or away from the wafer.

In some embodiments, the method further includes moving the solvent dispenser such that the outlet thereof is aligned with the alignment mark and close to the edge of the wafer, before the solvent is sprayed onto the photoresist layer on the alignment mark by the solvent dispenser. Also, the method further includes moving the suction unit such that the inlet thereof is aligned with the alignment mark and close to the edge of the wafer, before the dissolved photoresist layer and the solvent are removed from the wafer by the suction unit.

In some embodiments, the method further includes moving the solvent dispenser and the suction unit together along a direction from the edge of the wafer toward the inside of the wafer, when the solvent dispenser sprays the solvent onto the photoresist layer and the suction unit removes the dissolved photoresist layer and the solvent from the wafer.

In some embodiments, the method further includes providing an alignment unit to determine the position of the alignment mark of the wafer by searching for an orientation notch on the wafer and to generate a position signal.

In some embodiments, the method further includes providing a driving mechanism connected to the holder. Also, the method further includes driving the holder and the wafer to rotate by the driving mechanism according to the position signal from the alignment unit, so that the alignment mark reaches a position where the outlet of the solvent dispenser and the inlet of the suction unit are aligned with and close to the alignment mark.

In some embodiments, the method further includes providing a drain unit to collect the solvent falling from the wafer.

In some embodiments, the suction unit has an exhaust rate that is greater than 80 LPM (l/min).

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
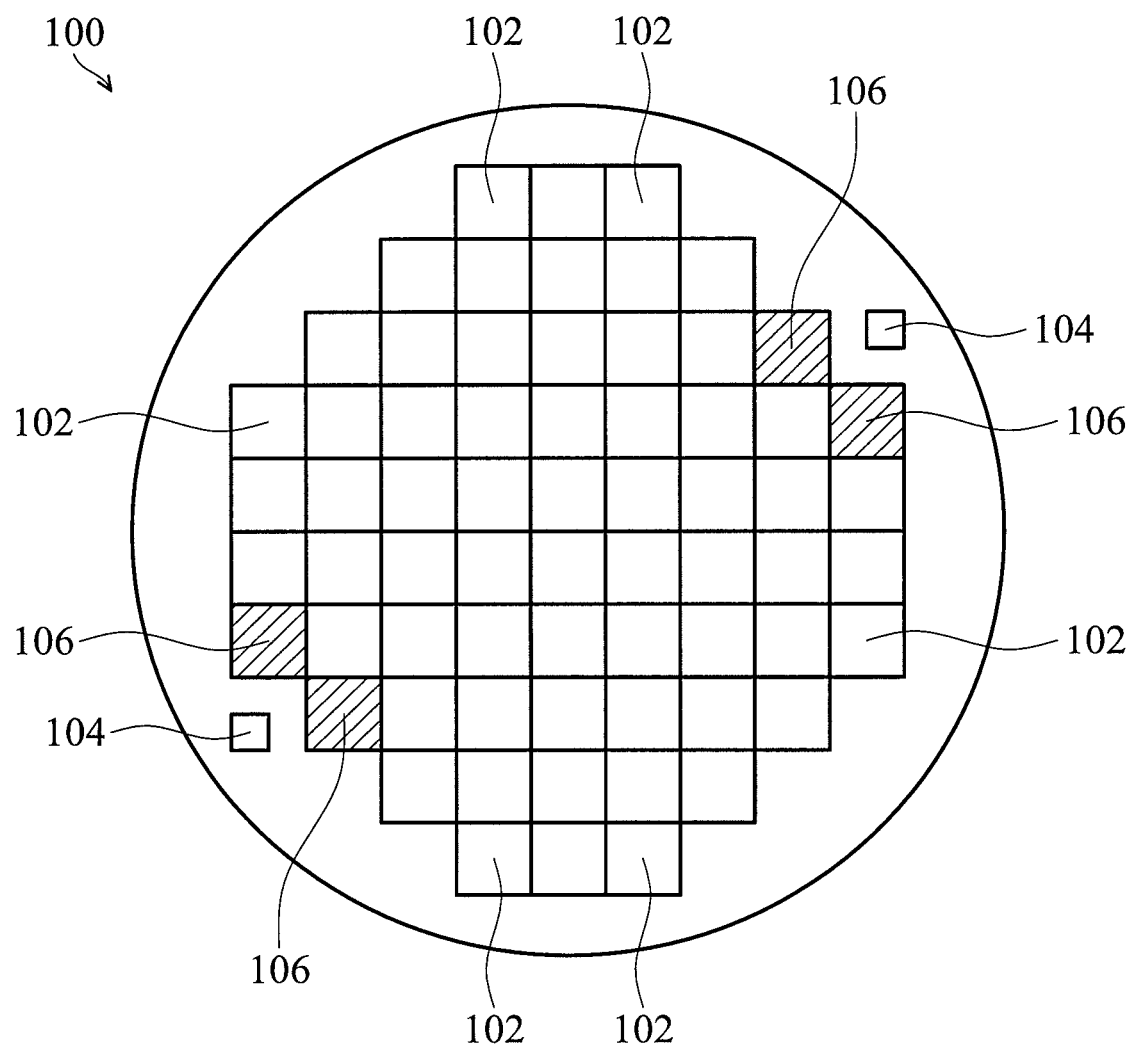
FIG. 1 is a schematic plane view of a conventional wafer.

A detailed description is given in the following embodiments with reference to the accompanying drawings. This description is provided for the purpose of illustrating the general principles of the invention and should not be taken in a limiting sense. The scope of the invention is best determined by reference to the appended claims.

In the following detailed description, the orientations of "on", "above", "under", and "below" are used for representing the relationship between the relative positions of each element as illustrated in the drawings, and are not meant to limit the invention. Moreover, the formation of a first element on or above a second element in the description that follows may include embodiments in which the first and second elements are formed in direct contact, or the first and second elements have one or more additional elements formed therebetween.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the invention.

Embodiments of an apparatus for removing a photoresist layer from at least one alignment mark of a wafer are provided. The apparatus may be independent from or integrated into a spin coater or other processing apparatuses.

Figure 2:
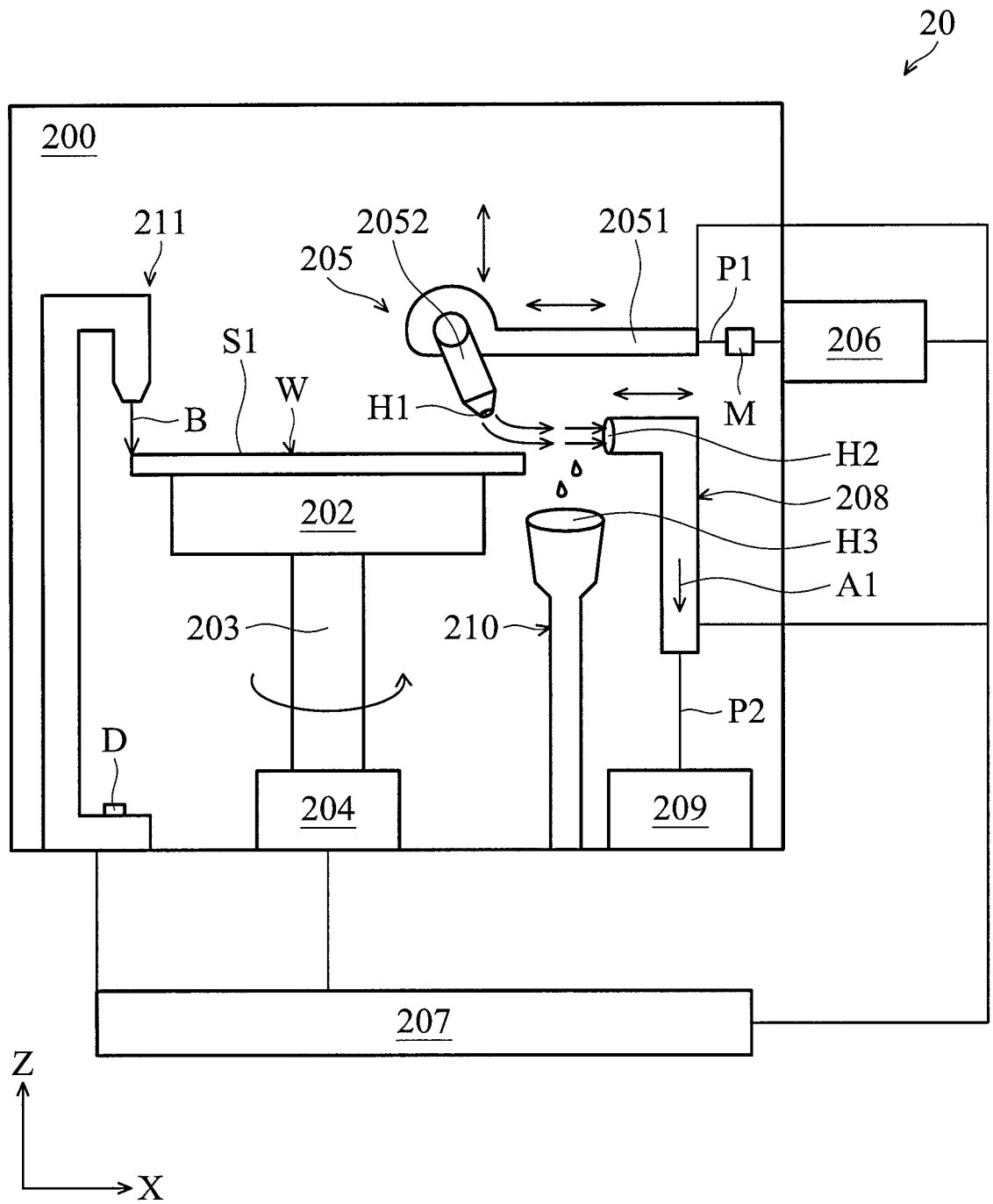
FIG. 2 is a block diagram of an apparatus for removing a photoresist layer from at least one alignment mark of a wafer in accordance with some embodiments.

FIG. 2 is a block diagram of an apparatus 20 for removing a photoresist layer from at least one alignment mark of a wafer in accordance with some embodiments. The apparatus 20 includes a sealed chamber 200 for accommodating the components described as follows.

A holder 202 is disposed in the chamber 200 for supporting a wafer W, such as a semiconductor wafer. The holder 202 can hold a 100 mm, 150 mm, 200 mm, 300 mm, or even a larger wafer W. For example, the wafer W can be transferred into and out of the chamber 200 through an opening (not shown) that is controlled by a gate valve assembly (not shown). Moreover, the wafer W can be transferred on and off the holder 202 using a robotic wafer transfer system (not shown). During processing, the wafer W can be held on top of the holder 202 using a vacuum chuck (not shown) therein. Alternatively, other clamping means may also be used.

As shown in FIG. 2, the holder 202 connects to a spindle 203. Moreover, the holder 202 and the wafer W thereon can be rotated (as shown in the figure by the arrow) by a driving mechanism 204 coupled to the spindle 203. In some embodiments, the driving mechanism 204 may also be used to drive the holder 202 along a Z-axis direction. The driving mechanism 204 may comprise a cylinder, a motor, a roller, a belt, or a combination thereof.

Figure 3:
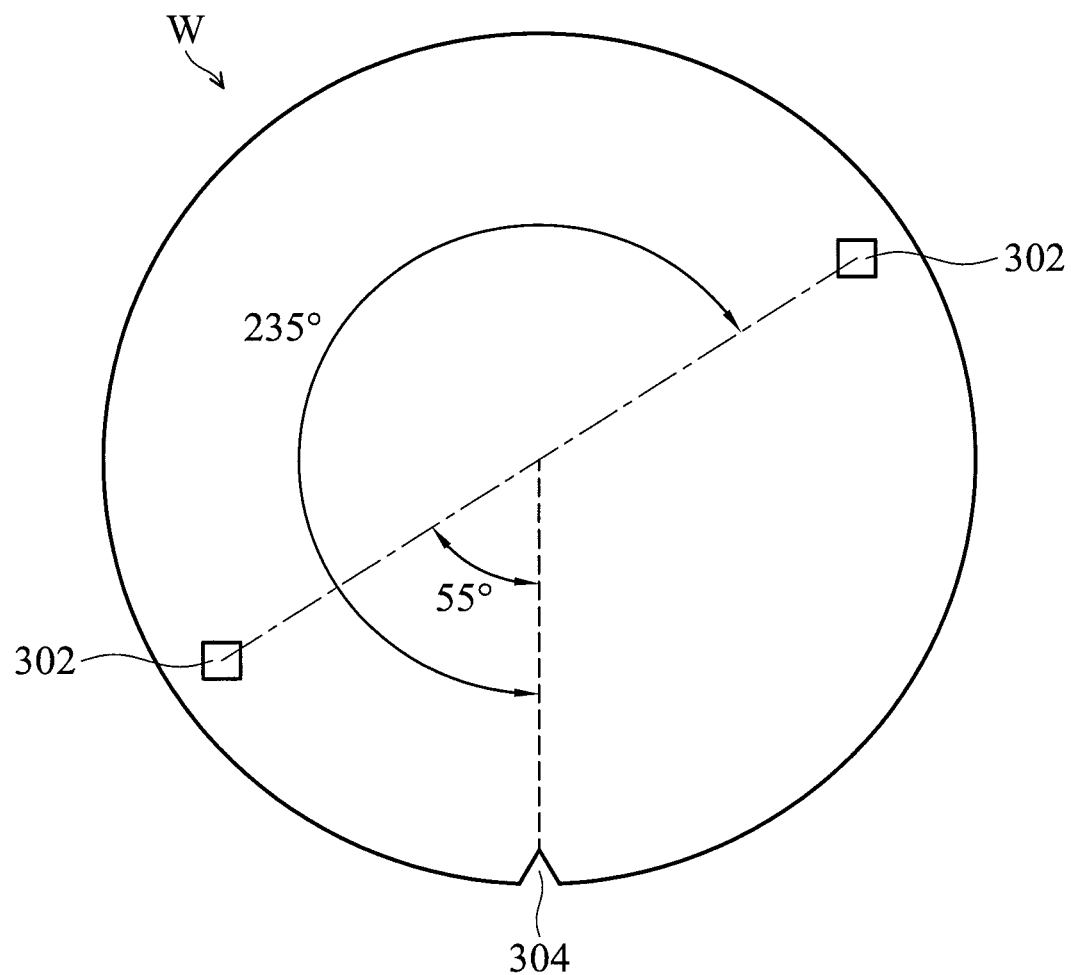
FIG. 3 is a schematic plane view illustrating the positions of the alignment marks of a wafer in relation to the orientation notch in accordance with some embodiments.

A solvent dispenser 205 is provided in the chamber 200 and used to spray a solvent onto the photoresist layer on at least one alignment mark of the wafer W. Referring to FIG. 3, in some embodiments, two alignment marks 302 are formed in the peripheral region of the wafer W (i.e. formed near the edge of the wafer W), however there may also be only one alignment mark 302 or more alignment marks 302 formed on the wafer W. A photoresist layer (not shown) is coated on the entire wafer W. The solvent provided by the solvent dispenser 205 (FIG. 2) is used to dissolve the photoresist layer on the alignment marks 302, so as to expose the alignment marks 302, thereby preventing the photoresist layer from covering or blurring the alignment marks 302 during alignment. The solvent is a photoresist dissolving agent which may comprise any optional chemicals used in this field.

As shown in FIG. 2, the solvent dispenser 205 connects to a solvent source 206 through a pipe P1. The solvent source 206 is used to store the solvent and electrically connects to a controller 207. The controller 207 is used to control the solvent source 206 to start and stop providing the solvent to the solvent dispenser 205 and is used to control the flow rate of the solvent provided to the solvent dispenser 205. As such, the controller 207 also controls the operation (such as switch and spraying rate) of the solvent dispenser 205. In some embodiments, a flow meter M is further provided to the pipe P1 to measure the flow rate of the solvent flowing therein (i.e. the spraying rate of the solvent dispenser 205).

In addition, the solvent dispenser 205 is movable in the chamber 200 so that its outlet H1 can be moved toward or away from the alignment mark in the peripheral region of the wafer W. Specifically, in some embodiments, the solvent dispenser 205 includes a movable arm 2051 and a nozzle 2052. The movable arm 2051, for example, is a robotic arm capable of moving in the chamber 200 through a motor 2053 and a cylinder 2054 (See FIG. 4B). The motor 2053 can drive the solvent dispenser forward and backward and the cylinder 2054 can drive the solvent dispenser up and down. The nozzle 2052 is connected to the movable arm 2051 for spraying the solvent onto the photoresist layer on the alignment mark in the peripheral region of the wafer W. Moreover, the controller 207 also electrically connects to the solvent dispenser 205 (by connecting to the motor 2053 and the cylinder 2054 in FIG. 4B, for example) and is used to control the movable arm 2051 to move along the Z-axis direction (i.e. to move upward and downward) and along an X-axis direction (i.e. to move forward and backward), as the double-headed arrows show in FIG. 2.

As shown in FIG. 2, in order to make the solvent easier to leave the wafer W, the nozzle 2052 is preferably configured to be inclined with respect to the surface S1 of the wafer W on which the alignment marks are formed, and the outlet H1 of the nozzle 2052 faces toward the edge of the wafer W. Note that the faster the solvent leaves the wafer W, the less chance there is of damage occurring to the IC dies (not shown) close to the alignment marks 302 (FIG. 3).

A suction unit 208 is provided adjacent to the peripheral region of the wafer W and used to remove the above dissolved photoresist layer (on the alignment mark) and the remaining solvent (without having reacted with the photoresist layer) from the wafer W through exhausting, for example. Specifically, as shown in FIG. 2, the suction unit 208 has a tube structure. The suction unit 208 is positioned in the chamber 200, and its inlet H2 is close to the edge of the wafer W. The suction unit 208 connects to an ejector 209, such as an exhaust pump, through a pipe P2. Moreover, the controller 207 also connects to the ejector 209 and is used to control the ejector 209 to start and stop exhausting. Accordingly, the controller 207 can control the suction unit 208 to remove the dissolved photoresist layer from the wafer W through exhausting (as the arrow A1 indicates in FIG. 2) by the ejector 209. Although not shown in the figure, the ejector 209 fluidly connects to a volatile organic compound exhaust (VEX) system at the facility end.

It addition, thanks to the suction provided by the suction unit 208, not only can the dissolved photoresist layer be quickly removed from the wafer W, but the remaining solvent (without having reacted with the photoresist layer) on the wafer W can also be quickly removed from the wafer W. For example, as shown in FIG. 2, when the nozzle 2052 is configured to be inclined with respect to the surface S1 of the wafer W and its outlet H1 faces toward the edge of the wafer W, the solvent provided by the solvent dispenser 205 can be driven (by the suction of the suction unit 208) to leave the wafer W faster. In other words, the solvent will not accumulate or stay on the wafer, so that the chance of damage occurring to the IC dies (not shown) close to the alignment marks 302 (FIG. 3) is reduced. As a result, the die loss can be reduced and the fabrication yield can be improved.

In some embodiments, the controller 207 also controls the exhaust rate of the suction unit 208. For example, the exhaust rate of the suction unit 208 is preferably controlled to be greater than 80 LPM (l/min), so that the solvent can leave the wafer W faster. Furthermore, during operation of the suction unit 208, the ejector generates a vacuum (negative) pressure, for example less than −70 KPA (Kilo-Pascals), to the suction unit 208, wherein the ejector may be a CDA (clean-dry-air) system having a CDA pressure greater than 5.7 kgf/cm$^2$, for example.

In addition, the suction unit 208 is also movable in the chamber 200 through a motor 2081 (see FIG. 4B) which can drive the suction unit 208 forward and backward. As shown in FIG. 2, the controller 207 also electrically connects to the suction unit 208 (by connecting to the motor 2081 in FIG. 4B, for example) and is used to control the suction unit 208 to move forward and backward (i.e. parallel to the X-axis direction, as shown in the figure by the double-headed arrow), so that the inlet H2 of the suction unit 208 is moved toward or away from the alignment mark(s) in the peripheral region of the wafer W. In accordance with some embodiments, the suction unit 208 is also movable along the Z-direction, which is driven by a cylinder (not shown).

A drain unit 210 is provided in the chamber 200 and is used to collect the solvent falling from the wafer W. As shown in FIG. 2, the drain unit 210 has a tube structure forming an inlet H3 on the top, and the drain unit 210 is positioned below the edge of the wafer W. Thus, as the solvent falls from the wafer W, it can be collected by the drain unit 210. Although not shown in the figure, the drain unit 210 fluidly connects to a waste processing system at the facility end.

Furthermore, in order to determine the position of the alignment mark(s) of the wafer W, an alignment unit 211 is provided in the chamber 200. Referring to FIG. 3, the wafer W is equipped with an orientation notch 304, and the two alignment marks 302 are situated near the wafer edge at positions of 55° and 235° measured from the orientation notch 304. The alignment unit 211 can search for the position of the orientation notch 304 (during rotation of the wafer W) through an optical method. For example, the alignment unit 211 can emit a light beam B (FIG. 2), and if the light beam B passes through the orientation notch 304, it can be detected by a detector D below the wafer W. Thus, the alignment unit 211 can determine the position of the orientation notch 304, and can also determine the positions of the alignment marks 302 due to the known degrees between the alignment marks 302 and the orientation notch 304.

The above two alignment marks 302 are merely exemplary, and the wafer W may comprise only one alignment mark 302 or more alignment marks 302, wherein the alignment marks 302 can be situated at any other positions in the peripheral region of the wafer W with various degrees from the orientation notch 304.

As shown in FIG. 2, the alignment unit 211 and driving mechanism 204 also electrically connect to the controller 207. After the orientation notch 304 is found, the alignment unit 211 generates a position signal comprising the rotation (degrees) parameter to the controller 207. Then, the controller 207 controls the driving mechanism 204 to drive the holder 202 and the wafer W to rotate according to the position signal, so that one of the alignment marks 302 (FIG. 3) reaches a predetermined (and stationary) position where the outlet H1 of the solvent dispenser 205 and the inlet H2 of the suction unit 208 are aligned with and close to the alignment mark 302. Afterwards, the photoresist layer on the alignment mark 302 of the wafer W can be removed by the solvent dispenser 205 and the suction unit 208 as described above. In accordance with some embodiments, the alignment accuracy (3) of the above alignment system (comprising the alignment unit 211 and the driving mechanism 204) is less than 0.5 mm.

After the photoresist layer on the above alignment mark 302 is successfully removed, the other alignment mark 302 on the wafer W can also be moved by the driving mechanism 204 (controlled by the controller 207) to reach the predetermined position for removal of the photoresist layer thereon.

With the design of providing an alignment unit 211 in the apparatus 20, the (automatic) apparatus 20 can quickly and accurately remove the photoresist layer from at least one alignment mark in the peripheral region of the wafer W, thereby reducing the processing time and improving the fabrication yield.

Figure 4A:
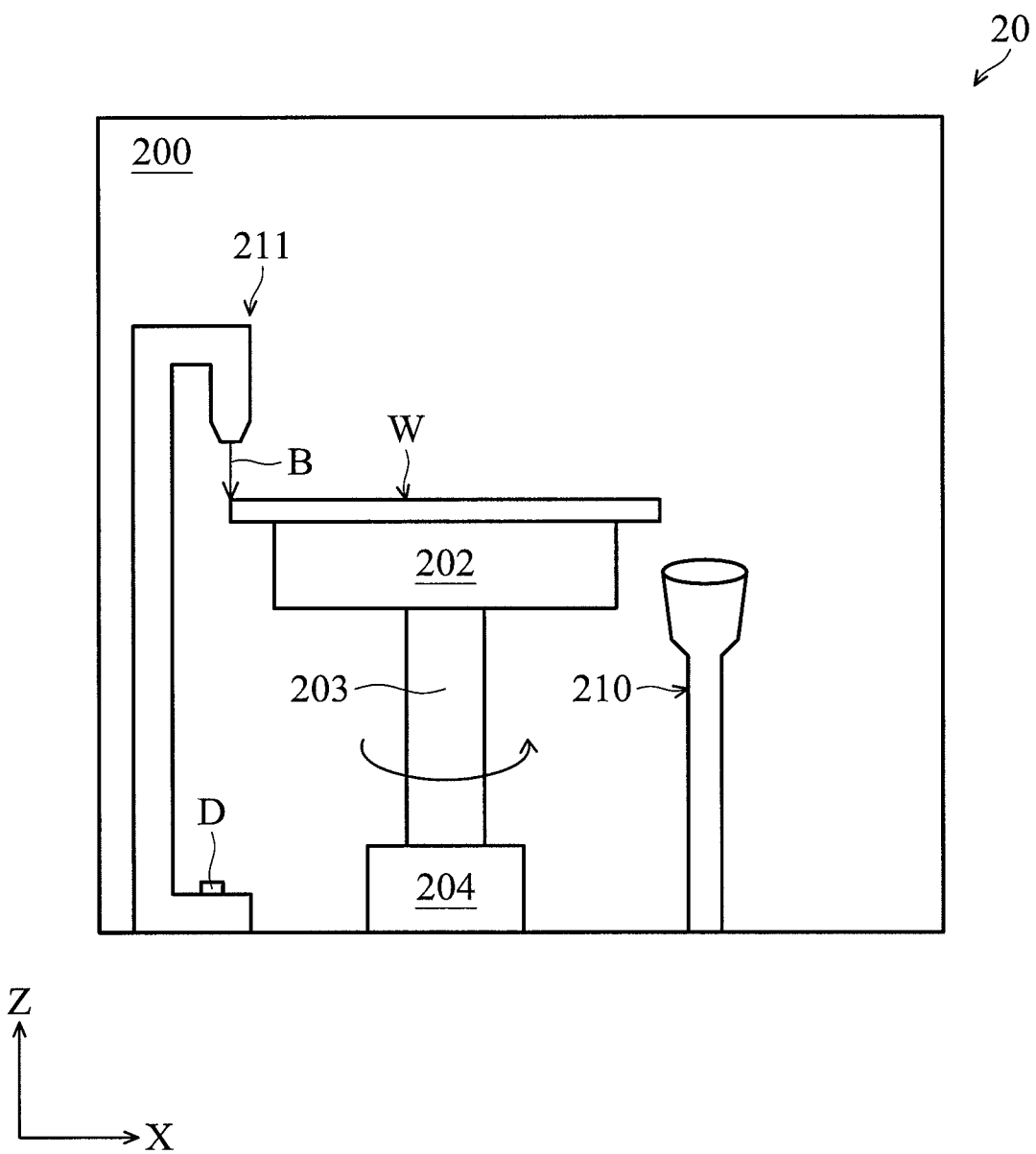
FIGS. 4A-4C are schematic views illustrating various stages of using the apparatus in FIG. 2 to remove the photoresist layer from the alignment mark of the wafer in accordance with some embodiments.
Figure 4B:
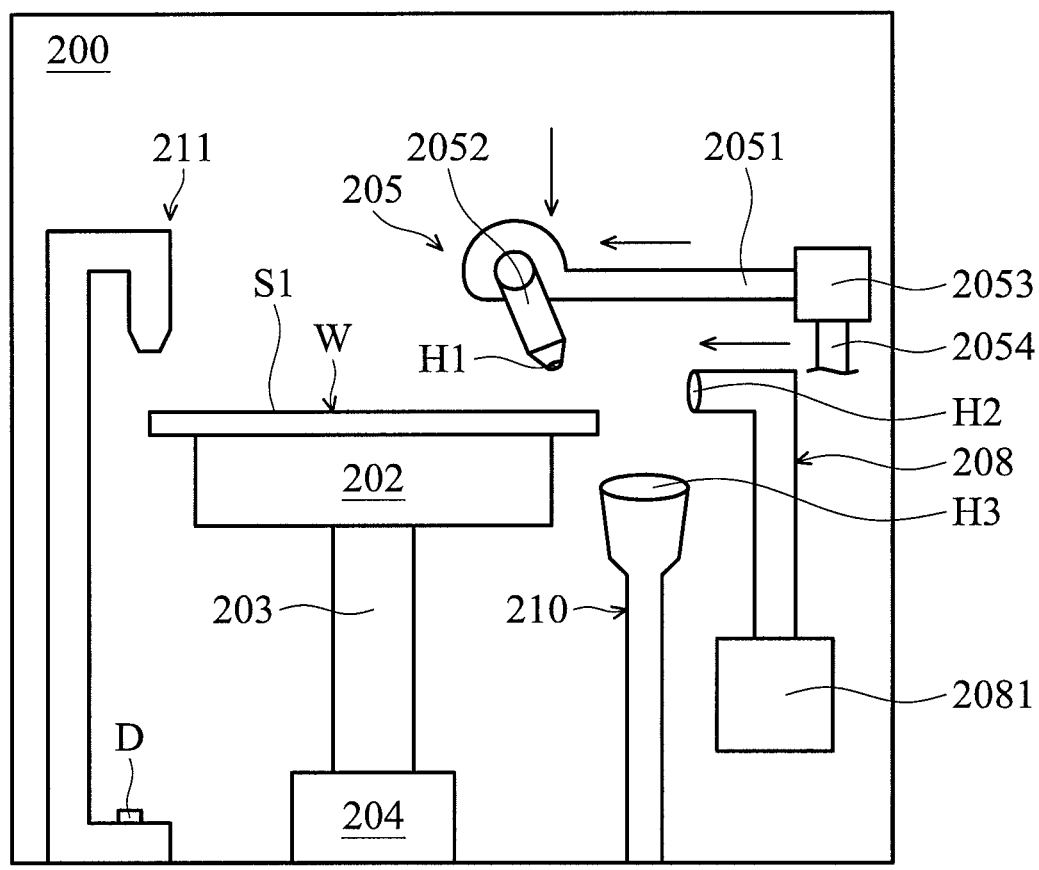
Figure 4C:
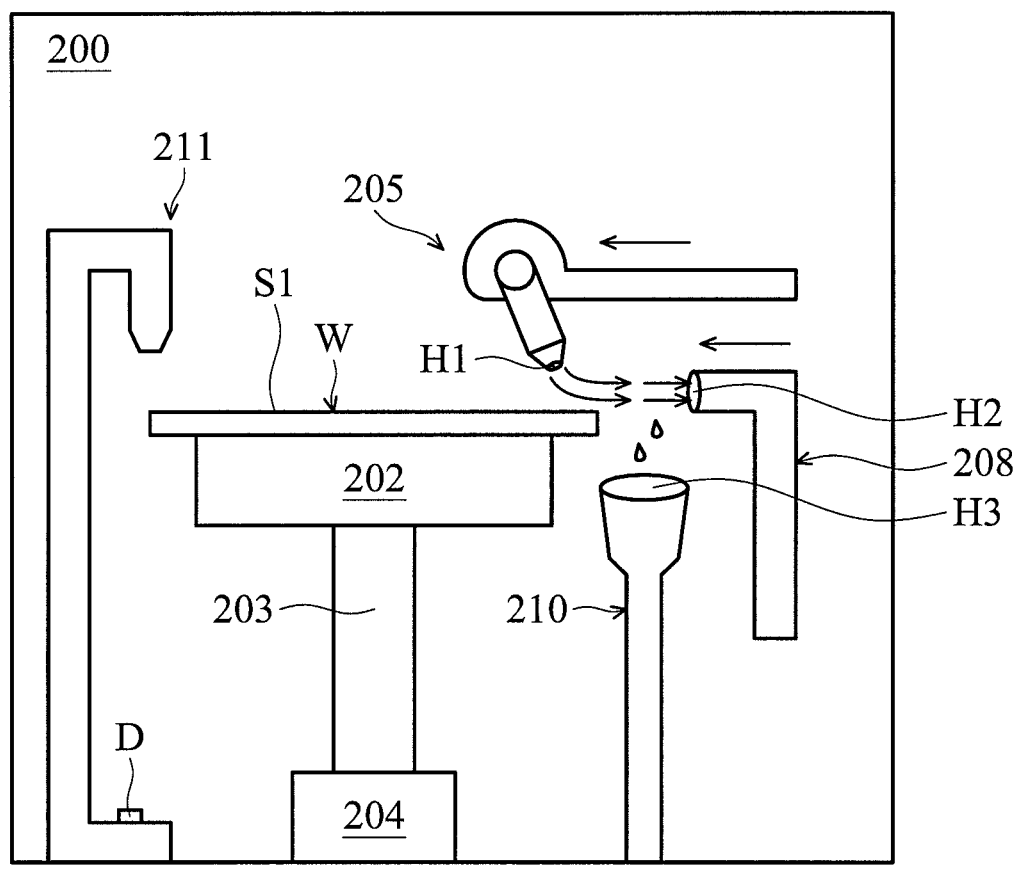

Next, the operation of the apparatus 20 in FIG. 2 in accordance with some embodiments is illustrated further with reference to FIGS. 4A-4C. Please refer to FIGS. 4A-4C in sequence.

As shown in FIG. 4A, a wafer W (see also FIG. 3) is placed on the holder 202 in the chamber 200. Then, the wafer W is rotated by the driving mechanism 204, and the alignment unit 211 can emit a light beam B to the edge of the wafer W for searing for the orientation notch 304. If the light beam B does not pass through the orientation notch 304, the driving mechanism 204 continues to rotate the holder 202 and the wafer W thereon; whereas, if the light beam B passes through the orientation notch 304 and is detected by the detector D, the driving mechanism 204 controlled by the controller 207 (see also FIG. 2) stops rotating the wafer W and the alignment unit 211 determines the position of the orientation notch 304. As described previously, if the alignment unit 211 determines the position of the orientation notch 304, it can also determine the positions of the alignment marks 302 of the wafer W due to the known degrees between the alignment marks 302 and the orientation notch 304.

Next, the alignment unit 211 generates a position signal for the controller 207, and the controller 207 controls the driving mechanism 204 according to the position signal to drive the holder 202 and the wafer W to rotate until one of the alignment marks 302 on the wafer W reaches a predetermined (and stationary) position.

As shown in FIG. 4B, after the above alignment mark 302 on the wafer W reaches the predetermined position, the solvent dispenser 205 is moved forward and downward by a motor 2053 and a cylinder 2054 controlled by the controller 207 (FIG. 2), and its outlet H1 can reach a predetermined position where it is aligned with the alignment mark 302 and close to the edge of the wafer W. Similarly, the suction unit 208 is moved forward by a motor 2081 controlled by the controller 207 (FIG. 2), and its inlet H2 can reach a predetermined position where it is aligned with the alignment mark 302 and close to the edge of the wafer W.

As shown in FIG. 4C, After the solvent dispenser 205 and the suction unit 208 reach their predetermined positions as described above, the solvent dispenser 205 sprays a solvent onto the photoresist layer on the alignment mark 302 to generate a dissolved photoresist layer, and the suction unit 208 can remove the dissolved photoresist layer and the solvent from the wafer W. As described previously, with the cooperation of the solvent dispenser 205 and the suction unit 208, the photoresist layer on the alignment mark 302 can be successfully removed and the solvent on the wafer W can also be quickly removed, thereby preventing the IC dies (not shown) close to the alignment mark 302 from being damaged too easily by the solvent, so that the fabrication yield is improved.

The drain unit 210 positioned below the edge of the wafer W can collect the solvent falling from the wafer W.

In addition, as shown in FIG. 4C, when the solvent dispenser 205 sprays the solvent onto the photoresist layer on the alignment mark 302 of the wafer W and the suction unit 208 removes the dissolved photoresist layer and the solvent from the wafer W, the solvent dispenser 205 and the suction unit 208 are preferably moved together along the same direction (e.g. from the edge to the inside of the wafer W, as shown by the arrows in the figure) parallel to the surface S1 of the wafer W. In this way, the damage caused by the solvent can be better prevented from occurring to the IC dies. However, in accordance with some embodiments, the solvent dispenser 205 and the suction unit 208 may also move together along the other direction that is from the inside to the edge of the wafer W, when the solvent dispenser 205 sprays the solvent onto the photoresist layer on the alignment mark 302 of the wafer W and the suction unit 208 removes the dissolved photoresist layer and the solvent from the wafer W.

After the photoresist layer on the above alignment mark 302 is removed, the driving mechanism 204 controlled by the controller 207 can also rotate the wafer W such that the other alignment mark 302 thereon reaches the above predetermined position. Then, the photoresist layer on the other alignment mark 302 can also be removed by the solvent dispenser 205 and the suction unit 20.

After the photoresist layer on the alignment marks 302 of the wafer W is successfully removed, the solvent dispenser 205 and the suction unit 20 can be moved in opposite directions to return to their original positions, and the wafer W can be transferred out of the chamber 200 to carry out the next process.

Figure 5:
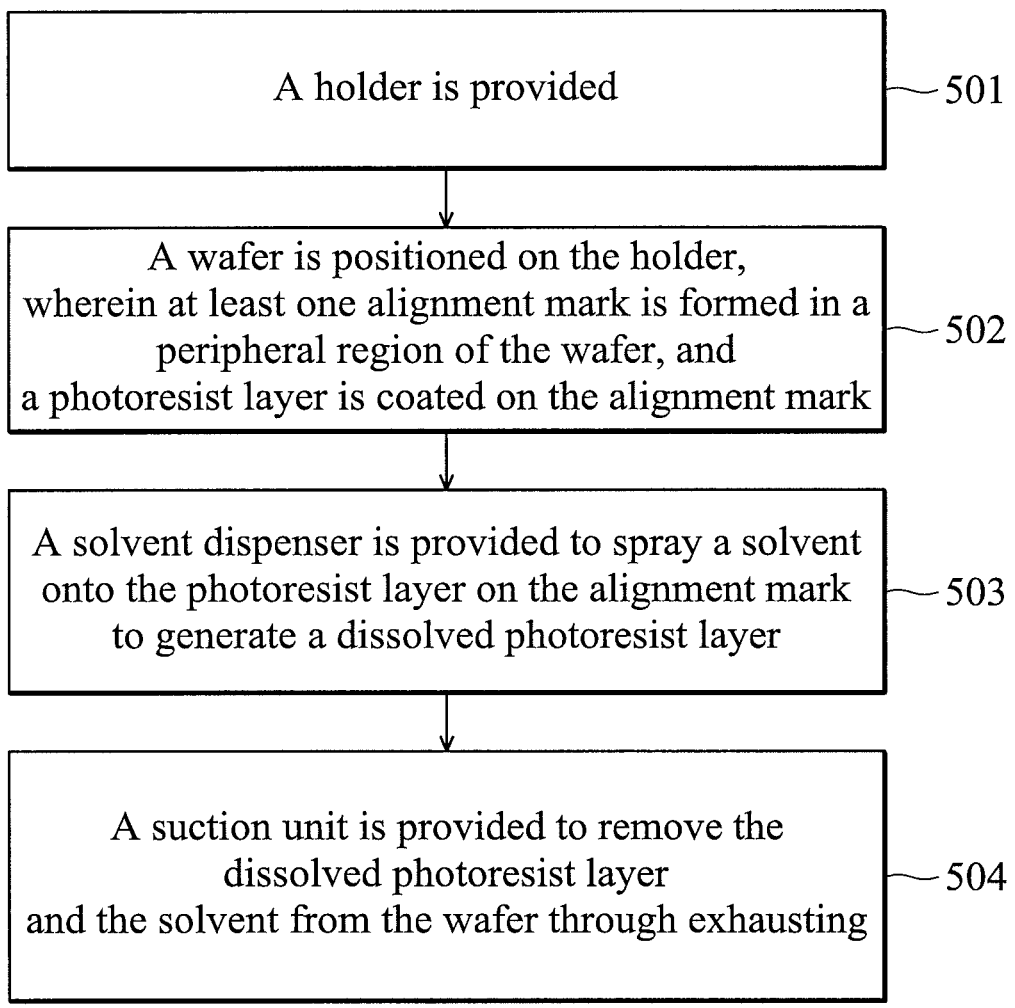
FIG. 5 is a flow chart illustrating a method for removing a photoresist layer from at least one alignment mark of a wafer in accordance with some embodiments.

FIG. 5 is a flow chart illustrating a method 500 for removing a photoresist layer from at least one alignment mark of a wafer in accordance with some embodiments. In step 501, a holder 202 is provided (see also FIG. 4A). In step 502, a wafer W (see also FIG. 3) is positioned on the holder 202 (see also FIG. 4A), wherein at least one alignment mark 302 is formed in a peripheral region of the wafer W, and a photoresist layer is coated on the alignment mark 302. In step 503, a solvent dispenser 205 is provided to spray a solvent onto the photoresist layer on the alignment mark 302 to generate a dissolved photoresist layer (see also FIG. 4C). In step 504, a suction unit 208 is provided to remove the dissolved photoresist layer and the solvent from the wafer W through exhausting (see also FIG. 4C).

It should be understood that the above method 500 is merely exemplary and that the method for removing the photoresist layer from at least one alignment mark of a wafer in some embodiments may also have other steps and/or other sequences of steps (such as determining the positions of the alignment marks with the alignment unit described above, moving the alignment mark on the wafer to a predetermined position using the driving mechanism described above, moving the solvent dispenser and/or the suction unit to their predetermined positions before the removal process for the photoresist layer on the alignment mark, and/or moving the solvent dispenser and the suction unit during the removal process).

As described above, embodiments of the present disclosure provide an apparatus and a method for removing a photoresist layer from at least one alignment mark of a wafer. The apparatus and the method can quickly and accurately remove the photoresist layer from at least one alignment mark in the peripheral region of the wafer, by determining the position of the alignment mark using the alignment unit (embedded in the apparatus), by spraying a solvent onto the photoresist layer using a solvent dispenser to dissolve the photoresist layer, and by removing the dissolved photoresist layer from the wafer using the suction unit. Moreover, the suction of the suction unit can help evacuate the solvent from the wafer faster, thereby reducing die loss (i.e. improving the fabrication yield) and the processing time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for removing a photoresist layer from at least one alignment mark of a wafer, comprising:
    a holder used to support the wafer, wherein the at least one alignment mark is formed in a peripheral region of the wafer;
    a solvent dispenser configured to spray a solvent onto the photoresist layer on the at least one alignment mark of the wafer to generate a dissolved photoresist layer, wherein the solvent dispenser comprises an outlet, the solvent dispenser comprising:
        a movable arm; and
        a nozzle connected directly to an end of the movable arm; and
    a suction unit configured to remove the dissolved photoresist layer and the solvent from the wafer,
    wherein the suction unit comprises an inlet, and the outlet of the solvent dispenser is oriented toward the inlet of the suction unit,
    wherein the solvent dispenser and the suction unit are individually movable toward or away from the wafer, and
    wherein the solvent dispenser and the suction unit are movable together along a direction that is parallel to a surface of the wafer.

2. The apparatus as claimed in claim 1, further comprising a motor used to drive the solvent dispenser forward and backward and a cylinder used to drive the solvent dispenser up and down.

3. The apparatus as claimed in claim 1, wherein the nozzle is configured to be inclined with respect to a surface of the wafer, and an outlet of the nozzle faces toward the edge of the wafer.

4. The apparatus as claimed in claim 1, further comprising a pipe and a flow meter, the pipe being connected to the solvent dispenser for supplying the solvent, and the flow meter is provided to the pipe for measuring the flow rate of the solvent flowing in the pipe.

5. The apparatus as claimed in claim 1, further comprising:
    an alignment unit used to determine the position of the at least one alignment mark of the wafer by searching for an orientation notch on the wafer and used to generate a position signal.

6. The apparatus as claimed in claim 5, further comprising:
    a driving mechanism connected to the holder and used to drive the holder and the wafer to rotate according to the position signal from the alignment unit, so that the at least one alignment mark reaches a position where an outlet of the solvent dispenser and an inlet of the suction unit are aligned with and close to the at least one alignment mark.

7. The apparatus according to claim 5, wherein the at least one alignment mark includes a first alignment mark positioned at 55° from the orientation notch and a second alignment mark positioned at 235° from the orientation notch.

8. The apparatus as claimed in claim 1, further comprising:
    a drain unit used to collect the solvent falling from the wafer.

9. The apparatus according to claim 1, wherein the nozzle of the solvent dispenser is inclined with respect to a surface of the wafer and faces toward the edge of the wafer.

10. The apparatus according to claim 1, wherein an exhaust rate of the suction unit is controlled to be greater than 80 LPM (l/min).

* * * * *